(12) United States Patent
Allibert et al.

(10) Patent No.: US 8,802,539 B2
(45) Date of Patent: Aug. 12, 2014

(54) CHARGE RESERVOIR STRUCTURE

(75) Inventors: Frédéric Allibert, Grenoble (FR);
Sébastien Kerdiles, Saint-Ismier (FR)

(73) Assignee: Soitec, Bernin (FR)

( * ) Notice: Subject to any disclaimer, the term of this patent is extended or adjusted under 35 U.S.C. 154(b) by 358 days.

(21) Appl. No.: 12/667,990

(22) PCT Filed: Jul. 21, 2008

(86) PCT No.: PCT/EP2008/059524
§ 371 (c)(1),
(2), (4) Date: Jan. 6, 2010

(87) PCT Pub. No.: WO2009/013268
PCT Pub. Date: Jan. 29, 2009

(65) Prior Publication Data
US 2010/0187649 A1 Jul. 29, 2010

(30) Foreign Application Priority Data
Jul. 26, 2007 (FR) ...................................... 07 56738

(51) Int. Cl.
*H01L 21/30* (2006.01)
*H01L 21/46* (2006.01)
(52) U.S. Cl.
USPC .................... 438/458; 257/506; 257/E21.568
(58) Field of Classification Search
CPC ................ H01L 21/76254; H01L 21/76251
USPC ........... 438/455, 458; 257/E21.567, E21.568, 257/506
See application file for complete search history.

(56) References Cited

U.S. PATENT DOCUMENTS

| 6,300,193 | B1 | 10/2001 | Forbes | 438/257 |
| 6,368,938 | B1 | 4/2002 | Usenko | 438/407 |
| 7,057,234 | B2 | 6/2006 | Tiwari | 257/324 |
| 7,528,049 | B2 * | 5/2009 | Ikeda et al. | 438/406 |
| 7,892,934 | B2 | 2/2011 | Kawai et al. | |
| 2002/0017657 | A1 | 2/2002 | Coffa et al. | 257/200 |
| 2002/0187618 | A1 * | 12/2002 | Potter | 438/455 |

(Continued)

FOREIGN PATENT DOCUMENTS

| DE | 102 16 838 | 11/2003 |
| DE | 102 16 838 A1 | 11/2003 |

(Continued)

OTHER PUBLICATIONS

International Search Report, PCT/EP2008/059524, mailed Sep. 22, 2008.

(Continued)

*Primary Examiner* — Daniel Luke
*Assistant Examiner* — Latanya N Crawford
(74) *Attorney, Agent, or Firm* — TraskBritt

(57) ABSTRACT

The present invention relates to a process for preparing semiconductor-on-insulator type structures that include a semiconductor layer of a donor substrate, an insulator layer and a receiver substrate. The process includes bonding of the donor substrate onto the receiver substrate, with at least one of the substrates being coated with an insulator layer, and forming at the bonding interface a so-called trapping interface of electrically active traps suitable for retaining charge carriers. The invention also relates to a semiconductor-on-insulator type structure that includes such a trapping interface.

18 Claims, 4 Drawing Sheets

(56) References Cited

U.S. PATENT DOCUMENTS

| | | | |
|---|---|---|---|
| 2003/0218212 A1 | 11/2003 | Lee et al. | |
| 2004/0108537 A1 | 6/2004 | Tiwari | 257/314 |
| 2004/0175899 A1* | 9/2004 | Lu et al. | 438/407 |
| 2005/0059213 A1* | 3/2005 | Steimle et al. | 438/260 |
| 2005/0079712 A1* | 4/2005 | Tong et al. | 438/689 |
| 2006/0166451 A1* | 7/2006 | Raskin et al. | 438/311 |
| 2007/0032040 A1 | 2/2007 | Lederer | 438/455 |
| 2007/0054466 A1* | 3/2007 | Hebras | 438/455 |
| 2007/0076482 A1* | 4/2007 | Kato | 365/185.14 |
| 2007/0170503 A1* | 7/2007 | Allibert et al. | 257/347 |
| 2007/0173033 A1* | 7/2007 | Allibert et al. | 438/455 |
| 2008/0020541 A1* | 1/2008 | Ikeda et al. | 438/406 |
| 2008/0171443 A1* | 7/2008 | Hebras | 438/703 |
| 2008/0237695 A1* | 10/2008 | Shino et al. | 257/324 |
| 2009/0102026 A1* | 4/2009 | Lee et al. | 257/635 |
| 2010/0055870 A1* | 3/2010 | Katou | 438/455 |

FOREIGN PATENT DOCUMENTS

| | | | |
|---|---|---|---|
| JP | 9246533 A | 9/1997 | |
| JP | 2000510284 A | 8/2000 | |
| JP | 2007506265 A | 3/2007 | |
| JP | 2007184466 A | 7/2007 | |
| WO | WO 2005031853 A1 * | 4/2005 | ............ H01L 21/762 |
| WO | WO2007072632 A1 | 6/2007 | |

OTHER PUBLICATIONS

Fu-Hsiang Ko et al., XP-002469060, "Sol-Gel-Derived Double-Layered Nanocrystal Memory", Applied Physics Letters, vol. 89, pp. 252111-1-252111-3, (2006).

Hötzl, R. et al., "Calibrated Contamination Spiking Method for Silicon Wafers in the $10^{10}$-$10^{12}$ Atom/cm$^2$ Range", Journal of the Electrochemical Society, vol. 146, No. 6, pp. 2245-2253, (1999).

Kan, E.W.H. et al., "Nanocrystalline Ge Flash Memories: Electrical Characterization and Trap Engineering", Advanced Materials for Micro and Nanosystems, Jan. 2005.

Makihara K. et al, XP-002469059, "Fabrication of Multiply-Stacked Structures of Si Quantum-Dots Embedded in SiO2 by Combination of Low-Pressure CVD and Remote Plasma Treatments", Department of Electrical Engineering, Graduate School of Advanced Sciences of Matter, Hiroshima University, Japan, Microprocesses and Nanotechnology, pp. 216-217, (2004).

Pavan, Paolo et al., "Flash Memory Cells—An Overview", Proceedings of the IEEE, vol. 85, No. 8, pp. 1248-1271, (1997).

\* cited by examiner

CHARGE RESERVOIR STRUCTURE

This application is a national phase entry under 35 U.S.C. §371 of International Patent Application PCT/EP2008/059524, filed Jul. 21, 2008.

FIELD OF THE INVENTION

The invention relates to a production process of a semiconductor-on-insulator type structure, used to store data within the structure.

BACKGROUND OF THE INVENTION

The production of flash memories is based on the use of MOS (Metal-Oxide-Semiconductor) devices with a floating grid embedded in the grid oxide, between the channel and the grid. The data is stored by trapping electrons in the floating grid, which acts as the memory component.

The principle of memory consists of modifying the current-voltage characteristics of a transistor according to the data stored.

Data storage consists of storing charges in the floating grid or, if applicable, in nodules. These charges induce the shift in the current-voltage curve, as represented by the arrow in FIG. 1. The data is read by looking at the current level at the reading voltage. In the example in FIG. 1, in state 0 (corresponding to a discharged grid), no current flows, in state 1 (corresponding to a charged grid), a current can flow.

The main advantage of nodules and other discrete storage devices lies in the fact that if a localized fault of the grid oxide occurs, the leak induced only discharges a single nodule and not the entire floating grid as in the case for continuous grids.

As a matter of fact, for around ten years, new memory devices comprising discrete storage devices and not conventional continuous storage devices in the floating grid have been developed to overcome the problems due to component miniaturization. In this way, discrete trapping memories can be found with materials such as nitride, so-called "high k" (i.e., high permittivity) materials or semiconductor nano-crystals.

Semiconductor nano-crystal (also referred to as nodules or dots) memories are very promising in terms of size reduction as they offer the advantage of a high integration density, low power consumption and low production cost. In this way, flash memories with silicon or germanium nano-crystals are found. In this respect, it is possible to refer, for example, to the article by Kan et al., "Nanocrystalline Ge Flash Memories: Electrical Characterization and Trap Engineering," Advanced Materials for Micro and Nanosystems, January 2005.

The principle of these nodule memories is based on an exchange of charges between the nano-crystals and the inversion layer via a thin tunnel dielectric. The charging and discharging of the electrons and therefore of the data is performed on each nodule.

Various techniques are now available to form nano-crystals within substrates, for example, aerosol techniques, or by means of PECVD (Plasma Enhanced Chemical Vapor Deposition), or by means of implantation.

U.S. Patent Publication No. 2002/0017657 thus describes the formation of nodules by means of implantation and heat treatment. The nano-crystals are formed in the oxide layer, which will subsequently be used as a grid oxide for non-volatile memory production.

However, the formation of nodules as described in this document is limited to silicon substrates and cannot be applied to multi-layer substrates, such as SeOI (semiconductor-on-insulator) type substrates.

In fact, the presence of the semiconductor layer on the substrate surface, above the insulating layer, renders the implantation step difficult. It would in fact be necessary to apply high implantation energies inducing in particular a loss of precision of the implanted region and the creation of damage in the semiconductor film.

In addition, the presence of the semiconductor layer does not enable the application of a heat treatment, such as that described in the document. In fact, the heat treatment used is an oxidizing treatment and the oxygen present would not react with the embedded insulator layer, but on the surface, with the semiconductor layer.

U.S. Patent Application No. 2004/0108537 provides for the formation of a structure comprising a base substrate, a charge trapping region and a semiconductor layer wherein electronic components such as transistors may be produced. The trapping region comprises one or more insulator layers, wherein atomic species or nano-crystals forming trapping centers are incorporated. However, this trapping region must have a sufficient thickness for the memory to function correctly. In fact, it is difficult to form a very thin region with a satisfactory homogeneity and a satisfactory quality. However, the thicker the trapping region, the higher the voltages to be applied.

Therefore, one of the aims of the invention is to enable data storage in a semiconductor-on-insulator (SeOI) type substrate, enabling the use of lower voltages than in the prior art.

SUMMARY OF THE INVENTION

A first aim of the invention relates to a production process of a semiconductor-on-insulator type structure comprising a semiconductor layer of a donor substrate, an insulator layer and a receiver substrate, the process comprising the bonding of the donor substrate on the receiver substrate, at least one of the substrates being coated with an insulator layer, the process comprising the formation at the bonding interface of a so-called "trapping interface" comprising electrically active traps suitable for retaining charge carriers.

The term "trapping interface" herein refers to the fact that the traps are located at a given depth Z of the structure, between two layers belonging to the structure, as opposed to a "layer," which displays a certain thickness. This term indicates that both layers on either side of the interface are in direct contact, and are not separated by a continuous surface. As illustrated in FIG. 2, the Z-axis is perpendicular to the surface of the various layers, with its origin at the free surface of the semiconductor layer and oriented in the direction of increasing depths.

According to a first embodiment of the invention, the trapping interface is formed at the interface between the insulator layer, coating one of the substrates, and the other substrate.

According to another embodiment of the invention, one of the substrates is coated with a first dielectric layer and the other substrate is coated with a second dielectric layer, such that the insulator layer is obtained by bonding both dielectric layers, the trapping interface being formed at the interface between these two layers.

Particularly advantageously, the thickness of the first dielectric layer, referred to as the "tunnel dielectric" is between 1.5 nm and 25 nm and the thickness of the second dielectric layer, referred to as the "control dielectric," is between 4 nm and 50 nm.

According to other characteristics of the invention, taken alone or in combination:

the process comprises, before bonding, the formation of electrically active defects on the surface of at least one of the layers located on the interface;

the formation of the defects is obtained by means of a plasma treatment, the plasma treatment being preferentially applied on the control dielectric layer; the plasma comprising oxygen, argon, nitrogen, chlorine or fluorine.

according to one alternative embodiment of the invention, the defects are obtained by means of a treatment suitable for depositing contaminants on the surface of at least one of the layers located on the interface;

the treatment is a heat treatment in an environment containing the contaminants; the contaminants are advantageously germanium atoms;

the treatment is a spin-coating of a solution containing the contaminants; the contaminants are germanium, dopants selected from column III, IV or V elements, ions selected from $K^+$, $Na^+$, $F^-$, $Cl^-$ or metals selected from iron and aluminium;

the bonding is bonding by means of molecular adhesion;

before bonding, at least one of the layers located at the interface is activated by means of plasma;

the process comprises, before the bonding, the formation of an embrittlement zone in the donor substrate so as to define a semiconductor layer and, after the bonding, a detachment along the embrittlement zone so as to transfer the semiconductor layer to the receiver substrate;

the receiver substrate is coated with the control dielectric layer and before the bonding, dopants displaying a density greater than $10^{17}$ cm$^{-3}$ are implanted in the receiver substrate, under the control dielectric layer, so as to form a conductive doped layer under the control dielectric layer.

Another aim of the invention relates to a semiconductor-on-insulator type structure comprising a semiconductor layer of a donor substrate, an insulator layer and a receiver substrate, the structure comprising a so-called "trapping interface" located in the insulator layer or at the interface between the insulator layer and one of the substrates, the trapping interface comprising electrically active traps suitable for retaining charge carriers.

Particularly advantageously, the insulator layer comprises a first dielectric layer and a second dielectric layer, the trapping interface being located at the interface between the two dielectric layers.

Preferentially, the thickness of the first dielectric layer, referred to as the "tunnel dielectric" is between 1.5 nm and 25 nm and the thickness of the second dielectric layer, referred to as the "control dielectric," is between 4 nm and 50 nm.

According to one particular embodiment, the receiver substrate is coated with the control dielectric layer, the receiver substrate being a composite substrate comprising a base substrate, an oxide layer and a conductive or semiconductor layer located under the control dielectric layer.

The first and second dielectric layers are preferentially in materials selected from $SiO_2$, $SiO_{2-x}N_x$ ($0 < x \leq 1$), high k type dielectrics, such as hafnium dioxide or yttrium oxide, strontium and titanium dioxide, alumina, zirconium dioxide, tantalum pentoxide, titanium dioxide, the nitrides and silicides thereof.

The trapping interface advantageously comprises contaminants selected from nitrogen, germanium, dopants selected from column III, IV or V elements, ions selected from $K^+$, $Na^+$, $F^-$, $Cl^-$ or metals selected from iron and aluminium, the contaminant concentration being between $10^{13}$ and $10^{15}$ atoms/cm$^2$.

BRIEF DESCRIPTION OF FIGURES

Other characteristics, aims and advantages of the invention will emerge from the detailed description hereinafter, with reference to the annotated figures wherein.

DETAILED DESCRIPTION OF THE INVENTION

Figure 1:
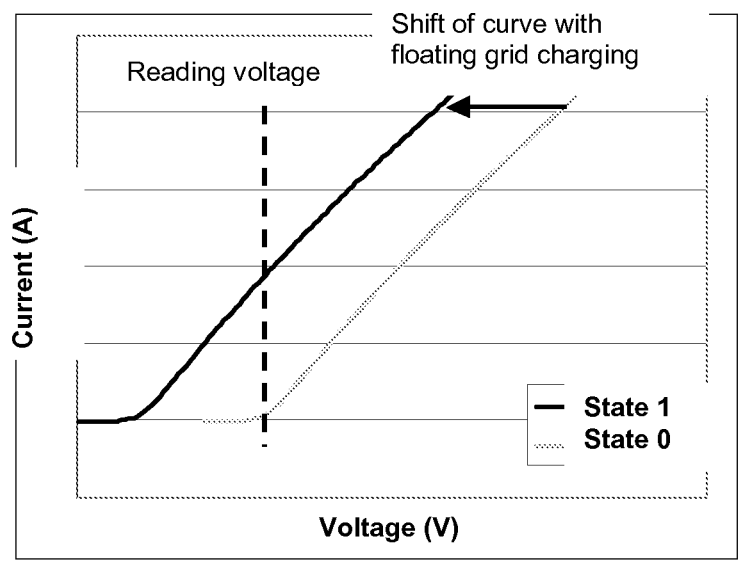
FIG. 1 illustrates the current-voltage curves according to the charged or discharged state of the grid.
Figure 2A:
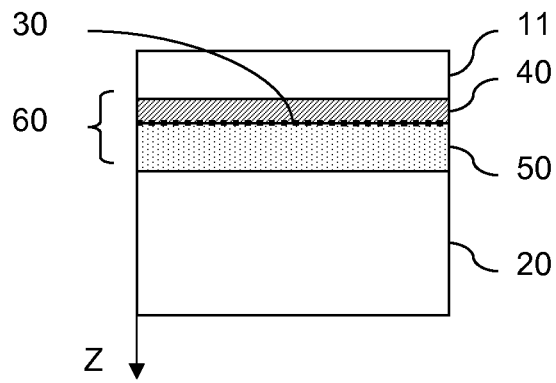
FIG. 2A illustrates an SeOI-type structure according to the invention.
Figure 2B:
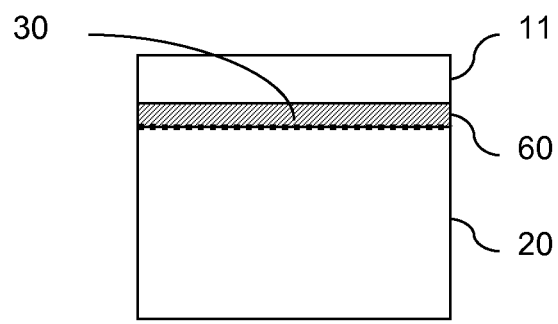
FIG. 2B illustrates an alternative embodiment of this structure.

As a general rule, the invention makes it possible to produce an SeOI-type structure comprising two substrates and an embedded insulator layer, wherein a so-called "trapping interface" contains electrically active traps suitable for retaining charge carriers. This trapping interface is located either inside an insulator layer (as represented in FIG. 2A, which will be described in detail below), or at an interface between one of the substrates and the insulator layer (as represented in FIG. 2B).

The traps are obtained by trapping, during bonding, electrically active defects present on the interface.

These defects are preferentially obtained by contamination of the surface of one of the two substrates before bonding.

Contamination consists of concentrating the impurities or contaminants on the surface of one of the substrates, which will form traps after placing the substrates in contact.

The term contaminant refers to any extraneous elements to the layer whereon they are located. Within the scope of the invention, the contaminants are electrically active or display hanging bonds or generate hanging bonds locally in a dielectric, such that the traps are suitable for capturing and retaining charge carriers. The term "charge carriers" refers either to electrons or holes.

In the case of memory applications, trapping is performed on an insulator layer.

Trapping consists generally of localizing a charge at a given point of the structure so that it can no longer move physically and, consequently, it can no longer take part in conduction. The charge may be released by means of an energy supply. The charge reaches the trap by means of a direct tunnel effect, indirect tunnel effect or, if applicable, by means of hot carriers and it is released by means of a direct or indirect tunnel effect.

The use of the invention to produce an SeOI-type, more specifically, an UTBOX (Ultra Thin Buried Oxide) type structure, wherein the embedded insulator comprises a trapping interface containing electrically active traps.

Such a structure is represented in FIG. 2A. The structure comprises a receiver substrate 20, an insulator layer 60 formed from two dielectric layers 40 and 50 and a thin layer 11 from a donor substrate, the trapping interface 30 being located inside the layer 60, at the interface between the two dielectric layers 40 and 50.

For memory applications, it is in fact preferred to form structures with thin embedded dielectric layers of 5 nm to 50 nm in order to favor the tunnel effect with reasonable voltages.

The traps are electrically active defects present on the bonding interface and act as nodules generally present in non-volatile memories.

As a general rule, the proposed process comprises the following steps:
- formation of a so-called "tunnel" dielectric on one of the two substrates;
- formation of a so-called "control" dielectric on the other substrate;
- treatment of the surface of at least one of the two dielectrics in order to create electrically active defects forming traps or charge reservoirs after bonding; and
- placing contact of the two substrates via the tunnel dielectric and control dielectric, for bonding by means of molecular adhesion.

The term dielectric refers to a material wherein the electrical conductivity is practically null. The term "tunnel dielectric" refers to a very thin dielectric; the so-called "control" dielectric being thicker. The ratio of the dielectric thicknesses must be sufficient so that it is possible to have charges pass through the tunnel dielectric by applying a voltage at the structure terminals, without the charges being able to pass through the control dielectric. To this end, it is possible either to use a sufficiently thin tunnel dielectric, i.e., of the order of 2 nm, so that it is possible for it to be passed through by means of a direct tunnel effect, or use a thicker dielectric and a higher voltage so that the charges pass via an indirect tunnel effect (or Fowler-Nordheim effect). In the latter case, the control dielectric should be substantially thicker than the tunnel dielectric, typically, the difference in thickness will be the order of a factor of 3 or more.

The substrates may consist of any type of semiconductor material such as silicon, germanium, III-V (GaAs, InP, etc.) compounds or alloys of these materials.

Both substrates may be of different types.

Either of the substrates may also be a composite structure such as an SeOI: in this case, it consists at least partially of conductive and/or insulating materials.

As a general rule, the layer of the structure in contact with the tunnel dielectric will preferentially be a semiconductor.

Similarly, the layer of the structure in contact with the control dielectric will preferentially be a semiconductor or a conductor (metal or very highly doped semiconductor). In this way, it is possible to implant a high dopant dose under the control dielectric layer. In this respect, it is possible to refer to Example 3 described below, and to FIG. 5.

The various steps of the process will now be described.

Tunnel Dielectric Formation

The tunnel dielectric material is selected from the following materials: $SiO_2$, $SiO_{2-x}N_x$ ($0<x\leq1$), high k type dielectrics, such as hafnium dioxide ($HfO_2$) or yttrium oxide, strontium and titanium dioxide, alumina, zirconium dioxide, tantalum pentoxide, titanium dioxide, the nitrides and silicides thereof.

As a general rule, any technique known to those skilled in the art to obtain a dielectric of an equivalent quality to that of a CMOS (complementary metal-oxide-semiconductor) component grid dielectric may be used. The expected quality is the thickness of a grid oxide of similar thickness for transistors dedicated to logical applications. Roadmaps issued by ITRS ("International Technology Roadmap for Semiconductors"), well-known to those skilled in the art, are available and used to define the desired physical and electrical characteristics, which will be directly dependent on the thickness of the layer.

It is also necessary to note that the dielectric layers used (tunnel or control) may be "composite" structures obtained from the reaction between two different types of layers. For example, if it is desired to deposit a layer of $HfO_2$ on Si, it is not deposited directly on a silicon surface but on an $SiO_y$ ($1<y\leq2$) type oxidized surface to subsequently deposit the $HfO_2$. In addition, irrespective of the type of layers present, the subsequent treatments applied to their structure may generate an interface that will no longer be clear but rather a gradient between the species present.

In this way, for the dielectrics deposited, any interface passivation technique, well-known to those skilled in the art, may be used.

In particular, it may be envisaged to use dry thermal oxidation, CVD (Chemical Vapor Deposition) or ALD (Atomic Layer Deposition), or a combination of these techniques or heat treatments intended to make several layers interact.

The thickness of the dielectric formed in this way is between 1.5 nm and 25 nm.

Control Dielectric Formation

The control dielectric material is selected from the following materials: $SiO_2$, $SiO_{2-x}N_x$ ($0<x\leq1$), high k type dielectrics, such as hafnium dioxide or yttrium oxide, strontium and titanium dioxide, alumina, zirconium dioxide, tantalum pentoxide, titanium dioxide, the nitrides and silicides thereof.

It is possible to use a thermal oxidation that makes it possible, for example, if the substrate is made of silicon, to form a silicon oxide layer. The deposition techniques mentioned above (CVD, ALD) may also be envisaged, along with wet thermal oxidation.

The thickness of the control dielectric is between 4 nm and 50 nm.

According to an alternative embodiment of the invention, illustrated in FIG. 2B, it is possible to only form an insulating layer 60 on the surface of one of the substrates (typically, the donor substrate from which the thin layer 11 is obtained) so as to form the trapping interface 30 at the interface between the insulator layer 60 and the receiver substrate 20 whereon the insulator layer 60 is bonded. In this case, it is no longer necessary to make a distinction between the "tunnel" and "control" dielectric. The following steps are applicable in this case. The treatment process is then applied onto the surface of the receiver substrate 20 and/or on the surface of the insulator layer 60. In this case, the treatment is preferentially performed on the surface of the insulating layer.

Defect Formation

As a general rule, electrically active defects are generated, for example, atoms capable of capturing, and to a certain extent retaining, charge carriers (electrons or holes).

Various processes may be used to form this type of defect on the surface of either of the dielectrics.

According to a first technique, surface defects are formed by applying a plasma preferentially on the control dielectric.

Plasma makes it possible to incorporate atomic species in the material to which it is applied. Incorporation is performed as in the case of a low-energy implantation with, if applicable, an additional chemical reaction between the plasma constituents and the material.

As the material is subject to ionic bombardment, its structure may be damaged or modified on a very low thickness (generally 3 nm to 6 nm under the conditions described herein). The defects generated may generally be subsequently restored by applying a heat treatment at a sufficient temperature. This heat treatment may lead to the diffusion of the incorporated atomic species and transform the very low thickness of damaged or modified material into an interface of defects.

The plasma treatment is preferentially applied to the control dielectric as, if it is applied to a very thin tunnel dielectric;

the plasma treatment is liable to modify the thickness thereof, which is to be avoided so as not to affect the characteristics thereof.

Various types of plasma may be used for this purpose, such as oxygen, argon, nitrogen plasma or even with chlorine, fluorine. The plasma power, pressure and exposure time will be adapted according to the desired defect size but also according to the type of plasma used.

However, plasma may only be used as a defect creation technique in some cases. In fact, if, at the end of the production process, all the effects of the plasma have been eliminated, this indicates that it did not create any defects. Typically, activation with $O_2$ or Ar plasma of an $SiO_2$ or Si layer, followed by annealing (possibly bonding reinforcement annealing) at a temperature of 950° C., will not leave any electrical active defects in the insulator layer.

The most effective defect generation will be obtained with plasmas containing elements wherein the presence generates defects and which are subject to low diffusion in the dielectric, such as nitrogen.

In this way, a nitrogen plasma converts the surface of an oxide into an oxynitride surface layer, which is electrically active. After thermal treatment, this surface layer may be considered as an interface or a surface of defects.

Another means to generate defects is to contaminate the surface of the treated layer. In this way, a heat treatment conducted in a furnace containing a specific level of contaminants generates surface defects.

Another technique consists of contaminating the dielectric surface by means of a spin-coating process. The principle of this process is to spread a small quantity of contaminants on a substrate using centrifugal forces. The selected contaminants are elements that can be placed in solution, for example, germanium or dopants, but also ions or metals. The dopants include the usual semiconductor dopants, i.e., B, As, P, Sb, In, Ga and, as a general rule, column III, IV and V elements of the periodic table. The ions may be selected from $K^+$, $Na^+$, $F^-$ or $Cl^-$. The metals will be selected from aluminium and iron. Elements liable to segregate at the bonding interface or which have a low diffusion coefficient in the dielectric will preferentially be selected.

In both cases (surface contamination or spin-coating), it is possible to achieve a thickness of contamination that corresponds to a fraction of atomic monolayer, i.e., some atomic species are disposed over the surface without forming a continuous layer over that surface.

The spin-coating may comprise the following successive steps:
  deposition of contaminant in solution on the dielectric;
  distribution of the contaminant on the entire surface of the dielectric by means of rotation;
  increase in the rotation speed in order to eliminate the excess contaminant;
  rotation at constant speed in order to establish the contaminant thickness; and
  rotation for a specified time to enable the evaporation of the solvent.

Surface Activation Before Bonding

As the dielectric layers are very thin, the surfaces are preferentially activated before the placing in contact thereof. Particularly advantageously, plasma activation will be used. In fact, thin dielectrics are applicable in this case and it is necessary to retain low heat treatments to prevent the diffusion of any contaminants. As a result, even if plasma is not used to create defects, it may be used to facilitate bonding. Therefore, it is possible to combine plasma activation with any of the contamination techniques described above.

Any plasma enabling bonding, such as an oxygen, nitrogen, argon, helium plasma, or a combination thereof, may be used for this purpose. In the case of a direct tunnel, the control dielectric is preferentially activated, so as not to modify the thickness of the tunnel dielectric. In the case of the indirect or Fowler-Nordheim tunnel, where the dielectrics are thicker, it is possible to activate one or both of the dielectrics.

Wafer Bonding and Carrier Trap Creation

The substrates are placed in contact with a view to bonding by means of molecular adhesion. To this end, surface preparation is performed prior to bonding: in this way, suitable cleaning, brushing and rinsing operations are applied in order to obtain a satisfactory substrate surface condition.

By placing both substrates in contact along an interface comprising electrically active defects, the electrically active defects are enclosed between the two substrates, which forms a trapping interface containing electrically active traps.

Only a portion of the contaminants may form traps, but depending on the kind of contaminant, it is possible that an atom of contaminant generates more than one trap.

The density of traps thus formed at the interface is comprised between $10^{12}$ and $10^{15}$ $cm^{-3}$.

The presence of defects on the bonding interface makes it possible to trap or release these charge carriers, thus, creating a memory effect. In fact, isolated defects may create a unique state in the insulator forbidden band. Physically, this state may be due to a hanging bond or to an atom, which would benefit considerably, in terms of energy, from retrieving an additional electron (electron trap) or, on the other hand, supplying an electron (hole trap).

The fact that the traps are located at the bonding interface and not in a layer of a certain thickness makes it possible to use lower voltages than in the prior art.

Furthermore, when the traps are located at an interface between two dielectric layers, the application of a voltage is required in order to charge or discharge them.

These traps are then said to be "slow" as compared to traps located at an interface between a dielectric layer and a semiconductor material. In the latter case, the "fast" traps charge and discharge during the normal use of the device and are usually not able to retain a charge during a time long enough to fulfil a memory function.

Another advantage of forming a trapping interface between two dielectric layers instead of a charge trapping layer as in prior art, is that the traps are all located at the same depth of the structure. Hence, when a device is formed based on this structure, the traps are all located at the same distance from a channel layer or a control electrode, which allows a better control of the traps by the grid. This results on a lower variability of the required voltages, and on a more abrupt transition between charged and discharged states.

Optionally, an additional heat treatment is used to reinforce the bonding interface.

Semiconductor Layer Detachment

If one of the two substrates (referred to as the donor substrate) has been previously implanted with a view to transferring a thin layer to the other substrate, a heat treatment is applied, which enables this transfer. If the donor substrate comprises a porous zone, the application of mechanical forces enables the detachment and transfer to the other substrate.

Finally, optionally, a finishing treatment may be applied in order to smooth the semiconductor layer transferred in this way.

Several examples of embodiments of the invention will now be described. The examples explained below are restricted to SeOI-type structures obtained by means of SMARTCUT® technology; however, it goes without saying that any other process using molecular bonding can be envisaged.

Example 1

Single SOI—Contamination by Means of Heat Treatment

Figure 3A:
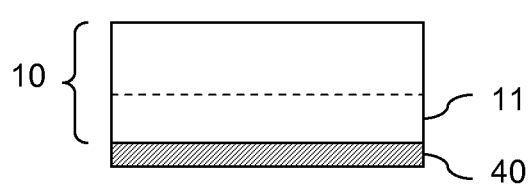
FIGS. 3A through 3E represent the steps of the process according to a first embodiment of the invention.

With reference to FIG. 3A, on the surface of a donor substrate 10 a 2 nm thick tunnel dielectric layer 40 is formed, and an implantation via the layer 40 is performed to form an embrittlement zone in the donor substrate 10, so as to define a thin layer 11.

Figure 3B:
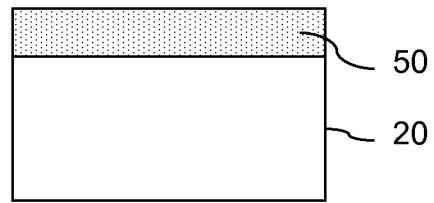

With reference to FIG. 3B, a base substrate (or receiver substrate) 20 comprising on the surface thereof an $SiO_2$ control dielectric layer 50 of the order of 5 nm, is placed in a furnace generally used for wafers comprising germanium. Therefore, the furnace is contaminated by germanium atoms.

Figure 3C:
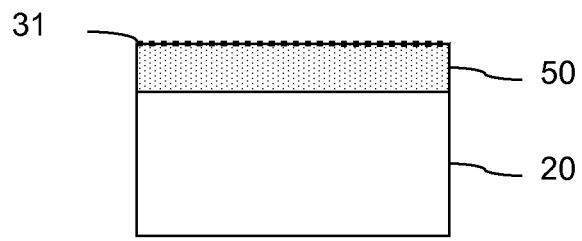

With reference to FIG. 3C, the base substrate 20 is subjected to a heat treatment of the order of 600° C., for approximately 1 hour, in argon. The concentration of contaminants 31 on the control dielectric surface 50 is of the order of $10^{13}$ to $10^{14}$ $cm^{-2}$.

The surface of the control dielectric 50 is then activated by means of a plasma treatment in argon, applied with a 150 W power and a 150 mTorr pressure for 20 seconds.

Figure 3D:
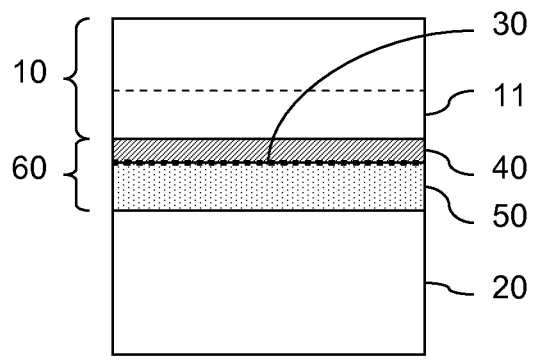

With reference to FIG. 3D, the donor substrate 10 is bonded on the base substrate 20 via dielectric layers 40 and 50, which makes it possible to form, at the bonding interface, a trapping interface 30. All the dielectric layers 40 and 50 form the embedded insulator layer 60 of the SeOI structure.

Figure 3E:
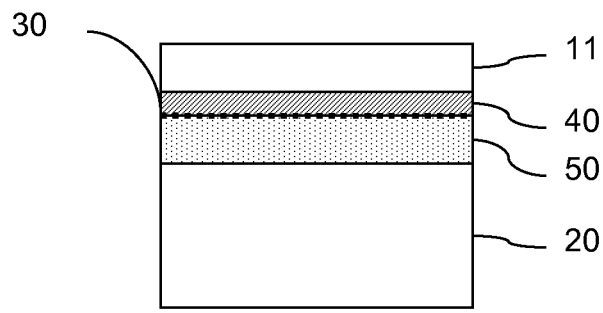

With reference to FIG. 3E, the thin layer 11 is detached from the donor substrate 10 by means of the application of a heat treatment of the order of 500° C. Stabilization annealing then makes it possible to reinforce the bonding interface.

Finally, optionally, a finishing treatment may be applied in order to smooth the thin layer 11 transferred in this way.

Example 2

Double SOI—Contamination by Means of Spin-Coating

Figure 4A:
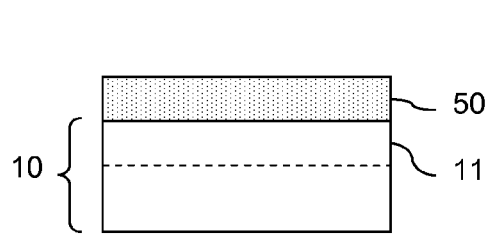
FIGS. 4A through 4E represent the steps of the process according to a second embodiment of the invention.

With reference to FIG. 4A, a donor substrate 10 is implanted so as to create an embrittlement zone defining a thin layer 11. A 7 nm thick control dielectric layer 50 is formed on the surface thereof.

An $O_2$ plasma treatment at 250 W, 150 mTorr is performed on the control dielectric for 15 seconds.

Figure 4B:
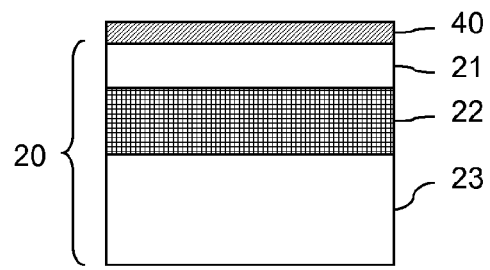

Moreover, with reference to FIG. 4B, an SeOI-type base substrate 20 is formed, comprising a substrate 23, a 145 nm thick embedded oxide layer 22 and a thin semiconductor layer 21. On this substrate, a tunnel dielectric 40 is formed.

Figure 4C:
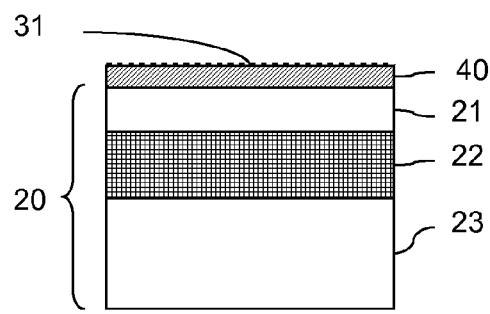

With reference to FIG. 4C, the surface of the tunnel dielectric 40 is contaminated by means of spin-coating.

To enable the deposition of germanium contaminants, of a concentration of the order of $10^{15}$ atoms/$cm^2$ by means of spin-coating, it is necessary to use germanium in a 0.01 mol/l acidified aqueous solution (i.e., approximately 0.7 g/l of germanium contaminants), the solution containing almost 1% nitric acid. The rotation speed is of the order of 3500 rpm. In this respect, it is possible to refer to the article by R. Hölzl et al, Journal of The Electrochemical Society, 146 (6), 2245-2253 (1999).

Figure 4D:
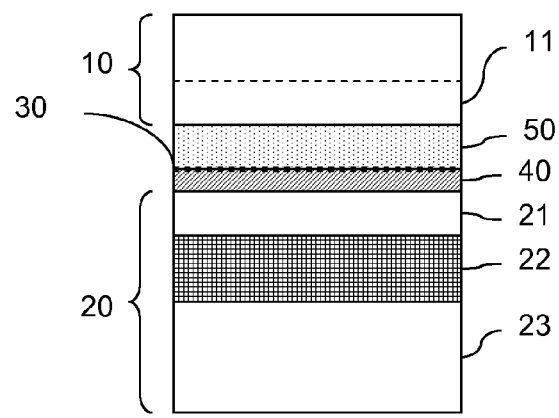
Figure 4E:
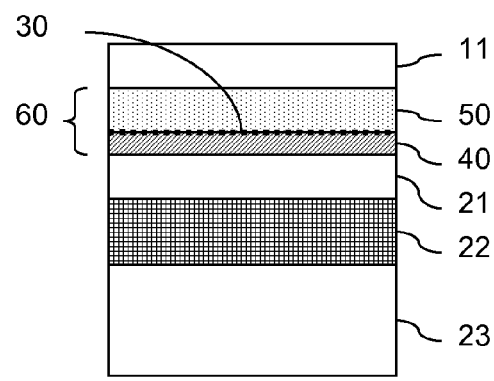

With reference to FIG. 4D, the substrate 10 is bonded on the substrate 20.

The remainder of the process is not different to that of the previous example.

Example 3

Single SOI—Plasma Contamination

This alternative embodiment may be described with reference to FIGS. 3A through 3E.

With reference to FIG. 3A, a donor substrate 10 comprising a tunnel dielectric layer 40 is implanted so as to define a thin layer. The tunnel dielectric thickness is 5 nm.

With reference to FIGS. 3B and 3C, a second substrate 20, or receiver substrate, made of silicon, comprises a control dielectric layer 50 made of $SiO_2$, formed by oxidizing the substrate 20 and displaying a thickness of the order of 20 nm.

Figure 5:
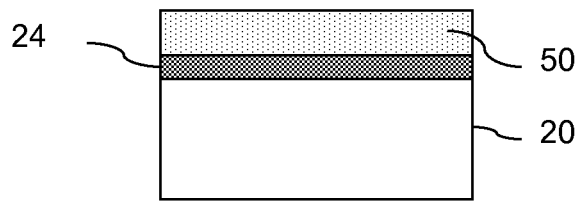
FIG. 5 illustrates a substrate according to a specific embodiment of the invention.

Optionally, with reference to FIG. 5, dopants are implanted in the receiver substrate 20, under the layer 50. The dopant density to be achieved under the layer 50 is greater than $10^{17}$ $cm^{-3}$, over a thickness of at least a few nanometers. This doped layer 24, under the control dielectric 50, is thus conductive.

To this substrate 20, a plasma treatment is applied, which is intended, first, to create defects represented by the reference numeral 31, and, second, to activate the surface to be bonded. To this end, a nitrogen plasma is used with a 250 W output, at a pressure of 50 mTorr, for 20 seconds.

With reference to FIG. 3D, the first and the second substrates 10, 20 are bonded such that the defects 31 are located at the interface, so as to form the trapping interface 30.

The remainder of the process is similar to that of Example 1.

The applications of such structures comprising a trapping interface include:

Application No. 1: Adjustable Voltage Devices and/or Circuits for Low-Consumption Applications.

The transistors or circuits are in principle manufactured in the SeOI thin semiconductor layer. The design of the components makes it possible to charge and discharge the traps present in the dielectric by means of a specially provided operation, such as, for example, a high polarization of the substrate or an electrode located under a BOX ("Buried Oxide") and the grounding of the source and the drain of the transistors.

When the BOX is charged, the transistor threshold voltage is increased, the current level of a given operating voltage is reduced (in particular, the leak current in static mode, generally referenced $I_{off}$).

This operation is not very fast but is particularly suitable in devices that have a stand-by function, particularly typically all mobile applications.

Application No. 2: Double-Grid Flash Memories

In order to reduce the size of "flash" type memories, double-grid memories are manufactured. In this way, the effective surface area of the memory is doubled without increasing its effective surface area on the silicon, which increases the integration density. By operating in double-grid mode, the control of the grid on the current is also reinforced. Therefore, improved control of the threshold voltage of the device is obtained by means of the memory effect, which provides higher-performance memories.

What is claimed is:

1. A process for preparing a semiconductor-on-insulator (SeOI) type structure that includes a semiconductor layer of a donor substrate, an insulator layer and a semiconductor receiver substrate, which process comprises:

bonding of the donor substrate to the receiver substrate, with one of the substrates being provided on its bonding surface with an insulator layer for contacting the bonding surface of the other substrate at a bonding interface, and forming at the bonding interface a trapping interface comprising electrically active defects which act as traps for retaining charge carriers, with the bonding surfaces on either side of the trapping interface being in direct contact and not separated by a continuous surface, wherein the trapping interface has a contaminant concentration of between $10^{12}$ and $10^{15}$ atoms/cm$^2$;

wherein the electrically active defects are formed on the surface of the other substrate prior to bonding;

wherein defects forming the trapping interface are located at a certain constant depth (Z) within the SeOI-type substrate, and wherein the defects are obtained by a treatment comprising depositing contaminants on at least one of the bonding surfaces, and the treatment comprises a heat treatment in an environment containing the contaminants, wherein the contaminants include germanium atoms.

2. The process of claim 1, wherein the bonding is by molecular adhesion.

3. The process of claim 1, which further comprises, before bonding, plasma activating at least one of the bonding substrates to enhance bonding.

4. The process of claim 1, which further comprises, before bonding, forming an embrittlement zone in the donor substrate which defines the semiconductor layer and, after bonding, detaching the semiconductor layer along the embrittlement zone to transfer the semiconductor layer to the receiver substrate.

5. The process of claim 1, which further comprises coating the receiver substrate with a control dielectric layer at the trapping interface before bonding.

6. A process for preparing a semiconductor-on-insulator (SeOI) type structure that includes a semiconductor layer of a donor substrate, an insulator layer and a semiconductor receiver substrate, which process comprises:

bonding of the donor substrate to the receiver substrate, with one of the substrates being provided on its bonding surface with an insulator layer for contacting the bonding surface of the other substrate at a bonding interface, and forming at the bonding interface a trapping interface comprising electrically active defects which act as traps for retaining charge carriers, with the bonding surfaces on either side of the trapping interface being in direct contact and not separated by a continuous surface, wherein the trapping interface has a contaminant concentration of between $10^{12}$ and $10^{15}$ atoms/cm$^2$;

wherein the electrically active defects are formed on the surface of the other substrate prior to bonding;

wherein defects forming the trapping interface are located at a certain constant depth (Z) within the SeOI-type substrate, and wherein the defects are obtained by a treatment comprising depositing contaminants on at least one of the bonding surfaces, and the treatment comprises spin-coating of a solution containing the contaminants, with the contaminants comprising germanium, dopants of column III, IV or V elements, ions of K$^+$, Na$^+$, F$^-$, or Cl$^-$, or iron or aluminum metal.

7. The process of claim 6, wherein the bonding is by molecular adhesion.

8. The process of claim 6, which further comprises, before bonding, plasma activating at least one of the bonding substrates to enhance bonding.

9. The process of claim 6, which further comprises, before bonding, forming an embrittlement zone in the donor substrate which defines the semiconductor layer and, after bonding, detaching the semiconductor layer along the embrittlement zone to transfer the semiconductor layer to the receiver substrate.

10. The process of claim 6, which further comprises coating the receiver substrate with a control dielectric layer at the trapping interface before bonding.

11. A semiconductor-on-insulator (SeOI) structure comprising:

a semiconductor layer of a donor substrate, a semiconductor receiver substrate, an insulator layer present at an interface between bonding surfaces of the donor and receiver substrates, and electrically active defects present on one of the substrates at the interface between the donor and receiver substrates;

a trapping interface located between the insulator layer and the other substrate, with the bonding surfaces on either side of the trapping interface being in direct contact and not separated by a continuous surface, wherein the trapping interface comprises the electrically active defects which act as traps for retaining charge carriers;

wherein defects forming the trapping interface are located at a certain constant depth (Z) within the SeOI structure; and wherein the receiver substrate includes a control dielectric layer, and is a composite substrate comprising a base substrate, an oxide layer and a conductive or semiconductor layer located beneath the control dielectric layer.

12. The structure of claim 11, wherein the insulator layer includes $SiO_2$, $SiO_{2-x}N_x$ ($0<x\leq1$), or a high k type dielectric of hafnium dioxide, yttrium oxide, strontium or titanium dioxide, alumina, zirconium dioxide, tantalum pentoxide, titanium dioxide, or of a nitride or silicide thereof.

13. A process for preparing a semiconductor-on-insulator (SeOI) type structure that includes a semiconductor layer of a donor substrate, an insulator layer and a semiconductor receiver substrate, which process comprises:

implanting dopants having a density greater than $10^{17}$ cm$^{-3}$ in the receiver substrate to form a conductive doped layer;

bonding of the donor substrate to the receiver substrate, with one of the substrates being provided on its bonding surface with an insulator layer for contacting the bonding surface of the other substrate at a bonding interface, and forming at the bonding interface a trapping interface comprising electrically active defects which act as traps for retaining charge carriers, with the bonding surfaces on either side of the trapping interface being in direct contact and not separated by a continuous surface;

wherein electrically active defects are formed on the surface of the other substrate prior to bonding; and wherein defects forming the trapping interface are located at a certain constant depth (Z) within the SeOI-type substrate.

14. The process of claim 13, wherein the bonding is by molecular adhesion.

15. The process of claim 13, which further comprises, before bonding, plasma activating at least one of the bonding substrates to enhance bonding.

16. The process of claim 13, which further comprises, before bonding, forming an embrittlement zone in the donor substrate which defines the semiconductor layer and, after bonding, detaching the semiconductor layer along the embrittlement zone to transfer the semiconductor layer to the receiver substrate.

17. The process of claim 13, which further comprises coating the receiver substrate with a control dielectric layer at the trapping interface before bonding.

18. The process of claim 13, wherein the electrically active defects are formed on the bonding surface of the insulator layer by a plasma treatment applied on the insulator layer.

* * * * *

UNITED STATES PATENT AND TRADEMARK OFFICE
CERTIFICATE OF CORRECTION

PATENT NO. : 8,802,539 B2
APPLICATION NO. : 12/667990
DATED : August 12, 2014
INVENTOR(S) : Frédéric Allibert and Sébastien Kerdiles Page 1 of 1

It is certified that error appears in the above-identified patent and that said Letters Patent is hereby corrected as shown below:

In the specification:
COLUMN 2, LINE 15, change "Application No." to --Publication No.--

In the claims:
CLAIM 1, COLUMN 11, LINE 13, change "wherein the electrically" to --wherein electrically--
CLAIM 1, COLUMN 11, LINE 17, change "substrate, and" to --structure, and--
CLAIM 6, COLUMN 11, LINE 54, change "wherein the electrically" to --wherein electrically--
CLAIM 6, COLUMN 11, LINE 58, change "substrate, and" to --structure, and--
CLAIM 13, COLUMN 12, LINE 62, change "substrate." to --structure.--

Signed and Sealed this
Twentieth Day of October, 2015

Michelle K. Lee
*Director of the United States Patent and Trademark Office*